(12) United States Patent
Perner

(10) Patent No.: US 6,980,455 B2
(45) Date of Patent: Dec. 27, 2005

(54) REMOTE SENSED PRE-AMPLIFIER FOR CROSS-POINT ARRAYS

(75) Inventor: Fredrick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 151 days.

(21) Appl. No.: 10/770,675

(22) Filed: Feb. 3, 2004

(65) Prior Publication Data

US 2005/0169034 A1   Aug. 4, 2005

(51) Int. Cl.[7] .............................................. G11C 17/00
(52) U.S. Cl. ..................................... 365/100; 365/158
(58) Field of Search ......................... 711/104; 365/50, 365/100, 158, 209, 211, 242

(56) References Cited

U.S. PATENT DOCUMENTS

| | | | |
|---|---|---|---|
| 6,188,615 B1 | 2/2001 | Perner et al. | |
| 6,259,644 B1 | 7/2001 | Tran et al. | |
| 6,262,625 B1 | 7/2001 | Perner et al. | |
| 6,462,980 B2 | 10/2002 | Schuster-Woldan et al. | |
| 6,587,384 B2 | 7/2003 | Perner | |
| 6,606,262 B2 | 8/2003 | Perner | |
| 6,608,790 B2 * | 8/2003 | Tran et al. ................... | 365/211 |
| 6,611,452 B1 | 8/2003 | Han | |
| 6,614,682 B2 * | 9/2003 | Hirai ........................... | 365/173 |
| 6,703,652 B2 * | 3/2004 | Van Brocklin et al. ..... | 257/209 |
| 6,791,865 B2 * | 9/2004 | Tran et al. ................... | 365/158 |
| 6,850,455 B2 * | 2/2005 | Rinerson et al. ............ | 365/158 |
| 2003/0202375 A1 * | 10/2003 | Sharma et al. .............. | 365/158 |
| 2003/0214835 A1 * | 11/2003 | Nejad et al. ................. | 365/158 |
| 2004/0136220 A1 * | 7/2004 | Cohen ......................... | 365/100 |
| 2005/0105327 A1 * | 5/2005 | Nazarian ..................... | 365/158 |
| 2005/0105329 A1 * | 5/2005 | Nazarian ..................... | 365/158 |

* cited by examiner

Primary Examiner—Richard Elms
Assistant Examiner—Alexander Sofocleous

(57) ABSTRACT

In a particular embodiment, there are a plurality of parallel electrically conductive rows and a plurality of parallel electrically conductive columns crossing the rows, thereby forming a cross-point array with a plurality of intersections. Resistive devices, such as magnetic memory cells, also known as spin valve memory cells, are provided in electrical contact with and located at each intersection. A feedback controlled sense pre-amplifier is also provided to maintain an equi-potential for a given memory cell. A reference voltage is provided to the sense pre-amplifier. As voltage potential, VA', is provided to the first end of a selected column, contacting a selected memory cell, a feedback voltage VA is provided to the sense pre-amplifier by an independent sense path. The independent sense path connects to the second end of the selected column. The sense pre-amplifier adjusts the applied potential VA to minimize the difference between the feedback and reference voltage.

26 Claims, 7 Drawing Sheets

REMOTE SENSED PRE-AMPLIFIER FOR CROSS-POINT ARRAYS

FIELD OF THE INVENTION

This invention relates generally to magnetic memory devices, and in particular to cross-point resistive devices, such as magnetic random access memory (commonly referred to as "MRAM") with a remote sensing pre-amplifier.

BACKGROUND OF THE INVENTION

Today's computer systems are becoming increasingly sophisticated, permitting users to perform an ever increasing variety of computing tasks at faster and faster rates. The size of the memory and the speed at which it can be accessed bear heavily upon the overall speed of the computer system.

Generally, the principle underlying the storage of data in magnetic media (main or mass storage) is the ability to change and/or reverse the relative orientation of the magnetization of a storage data bit, i.e., the logic state of a "0" or a "1." The coercivity of a material is the level of demagnetizing force that must be applied to a magnetic particle to reduce and/or reverse the magnetization of the particle. Generally speaking, the smaller the magnetic particle, the higher its coercivity.

A prior art magnetic memory cell may be a tunneling magneto-resistance memory cell (TMR), a giant magneto-resistance memory cell (GMR), or a colossal magneto-resistance memory cell (CMR). These types of magnetic memory cells are commonly referred to as spin valve memory cells (SVM). FIGS. 1A and 1B provide a perspective view of a typical prior art magnetic memory cell having two conductors.

As shown in prior art FIGS. 1A and 1B, a magnetic spin valve memory cell 100 generally includes a data layer 101 (also called a storage layer or bit layer), a reference layer 103, and an intermediate layer 105 between the data layer 101 and the reference layer 103. The data layer 101, the reference layer 103, and the intermediate layer 105 can be made from one or more layers of material. Electrical current and magnetic fields may be provided to the SVM cell 100 by an electrically conductive row conductor 107 and an electrically conductive column conductor 109.

In a typical MRAM device, the SVM cells 100 are arranged in a cross-point array. Parallel conductive columns, also referred to as word lines, cross parallel conductive rows, also referred to as bit lines. An SVM cell 100 is placed at each intersecting cross-point between a row and column. By selecting a particular row and a particular column, a specific SVM cell 100 may be selected. A typical MRAM cross-point array may easily consist of at least 1,000 rows and 1,000 columns uniquely addressing 1,000,000 SVM cells 100.

The data layer 101 is usually a layer of magnetic material that stores a bit of data as an orientation of magnetization M2 that may be altered in response to the application of an external magnetic field or fields. More specifically, the orientation of magnetization M2 of the data layer 101 representing the logic state can be rotated (switched) from a first orientation, representing a logic state of "0", to a second orientation, representing a logic state of "1", and/or vice versa.

The reference layer 103 is usually a layer of magnetic material in which an orientation of magnetization M1 is "pinned", as in fixed, in a predetermined direction. The direction is predetermined and established by microelectronic processing steps employed in the fabrication of the magnetic memory cell.

Typically, the logic state (a "0" or a "1") of a magnetic memory cell depends on the relative orientations of magnetization in the data layer 101 and the reference layer 103. For example, when an electrical potential bias is applied across the data layer 101 and the reference layer 103 in an SVM cell 100, electrons migrate between the data layer 101 and the reference layer 103 through the intermediate layer 105. The intermediate layer 105 is typically a thin dielectric layer commonly referred to as a tunnel barrier layer. The phenomena that cause the migration of electrons through the barrier layer may be referred to as quantum mechanical tunneling or spin tunneling.

The logic state may be determined by measuring the resistance of the memory cell. For example, if the overall orientation of the magnetization in the data layer 101 is parallel to the pinned orientation of magnetization in the reference layer 103, the magnetic memory cell will be in a state of low resistance, R. If the overall orientation of the magnetization in the data layer 101 is anti-parallel (opposite) to the pinned orientation of magnetization in the reference layer 103, the magnetic memory cell will be in a state of high resistance, R+$\Delta$R. The orientation of M2 and, therefore, the logic state of the SVM cell 100 may be read by sensing the resistance of the SVM cell 100.

The resistance may be sensed by applying a voltage to a selected SVM cell 100 and measuring a sense current that flows through the SVM cell 100. Ideally, the resistance is proportional to the sense current.

However, sensing the resistance state of a given SVM cell 100 in the cross-point array can be unreliable. All of the SVM cells 100 within the array are coupled together through the parallel sets of row and column conductors. The resistance of a selected SVM cell 100 at one cross-point equals the resistance of the memory cell at that cross point in parallel with the resistances of the unselected SVM cells 100. The cross-point array may be characterized and described more simply as a resistive cross-point device.

The isolation of a specific SVM cell 100 may be obtained through the use of diodes and transistors—having a non linear element in series with every linear element. With an applied bias the desired non linear element may be a low resistance while all others remain at a high resistance. However, placing diodes or transistors with each SVM cell 100 is costly in manufacturing efforts, time and physical space.

A possible alternative relies on the concept of equi-potential. Simply stated, if the same voltage is applied on both sides of a resister no current will flow through the resister. For a memory component, applying the same voltage to multiple SVM cells 100 likewise attempts to insure that no current flows through. When the resistance is changed in a selected SVM cell 100, the current flow through that particular SVM cell 100 can be detected and its state inferred.

To employ an equi-potential system in an array with a few elements is relatively easy. However, MRAM cross-point arrays having 1,000 or more rows and columns require very precise control to balance the voltage on either side of the resister (i.e. the SVM cells).

FIG. 2 provides an illustration of a prior art resistive cross-point memory array 200. Column conductors 201, 203 and 205 cross row conductors 207, 209 and 211. Resistive devices, such as SVM cells 213, 215, 217, 219, 221, 223, 225, 227 and 229 are placed at each cross-point. Each row and column also exhibits resistive properties illustrated as resistors 231, 233 and 235. Also provided are an adaptive pre-amplifier 237, capacitor 239, voltage source 241 and digital to analog converter 243.

A voltage may be applied to specifically selected SVM cell 215 by power conductor 245 running to a switching element 247, selecting column 203 and switching element 249 selecting row 209 and connecting to a ground or other low voltage. Thus is established a power path, represented as dotted line 251, running from the capacitor 239, through the selected SVM cell 215 to a ground or other low voltage. In an equi-potential setting, the most variable voltage applied to the cross-point memory array 200 is the one on the selected column line 203. As such, it is desirable that the voltage on the selected column 203 be very close to the voltage supplied to the unselected resistive devices, for example the remaining SVM cells.

To permit this control an adaptive pre-amplifier 237 may be employed. In this setting the adaptive pre-amplifier 237 is provided with a voltage VA and generates a sense voltage VA', in theory reflecting the voltage actually delivered to the selected SVM cell 215.

However, it will be appreciated that the voltage VA' is a local sense voltage, the sample being taken from before the voltage actually has reached the selected SVM cell 215. As conceptually illustrated, selected SVM cell 215 is at the center of the cross-point memory array 200. As such, the power path travels through a number of elements, each of which adds a resistance.

As shown, there is the resistance of the power path 251, illustrated as resistor 253, resistance at the switching element 247, and along the column 203, illustrated as resistors 233 and 235. If SVM cell 213 was the selected SVM cell, additional resistance would occur, illustrated as resistor 231. If SVM cell 217 was selected, resistance from resistor 233 would not be encountered.

As such, the local sense may have a significant amount of variance depending on how close to or how far from the selected column the selected SVM cell falls. As a result the equi-potential balance of voltage may be off, permitting an undesired transfer of current, (commonly know as sneak current or parasitic current) through unselected SVM cells.

Given the propensity for sneak current to occur in the memory array 200, the design parameters of memory array 200 are generally accommodating to these undesirable currents. Although very slight, this accommodation does impose larger components resulting in a subsequently larger memory array 200.

Hence, there is a need for an ultra-high density resistive device, such as a magnetic memory device, which overcomes one or more of the drawbacks identified above. The present invention accomplishes this objective, among others.

SUMMARY OF THE INVENTION

The invention provides a remote sensed pre-amplifier for resistive cross-point arrays such as MRAM.

In particular and by way of example only, according to an embodiment of the present invention, a data storage device is provided, including: a cross-point array of resistive devices, and a feedback controlled sense pre-amplifier receiving a reference voltage and feedback from the cross-point array when a potential is applied to a selected resistive device within the array, the sense pre-amplifier adjusting the applied potential to minimize the difference between the feedback and reference voltage; wherein the feedback is received from an independent sense path.

In yet another embodiment, the invention may provide a method of performing a read operation on a selected memory cell in a resistive cross-point array consisting of a plurality of parallel electrically conductive rows crossing a plurality of electrically conductive columns, each row and column having a first and second end, a plurality of magnetic memory cells in electrical contact with and located at the intersection between the rows and columns and a feedback controlled sense pre-amplifier coupled to the first end of the column crossing the selected memory cell, the method including: applying a first voltage to a first end of a selected row conductor; applying a second voltage to at least a subset of unselected row and unselected column conductors; applying a third voltage to the first end of a selected column conductor; sensing the remote feedback voltage from the second end of the selected column conductor intersecting the selected memory cell; comparing the feedback voltage to a reference voltage; and determining the resistance state of the selected memory cell while adjusting the third voltage to minimize the difference between the feedback voltage and the reference voltage.

These and other features and advantages of the preferred apparatus and method will become apparent from the following detailed description taken in conjunction with the accompanying drawings, which illustrate, by way of example, the principles of the invention.

DETAILED DESCRIPTION

Before proceeding with the detailed description, it is to be appreciated that the present invention is not limited to use or application in conjunction with a specific type of computer system, operating system or non-volatile main memory. Thus, although the present invention is, for the convenience of explanation, depicted and described with respect to typical exemplary embodiments, it will be appreciated that this invention may be applied with other types of resistive devices, computer systems, operating system and non-volatile main memory.

Figure 1A:
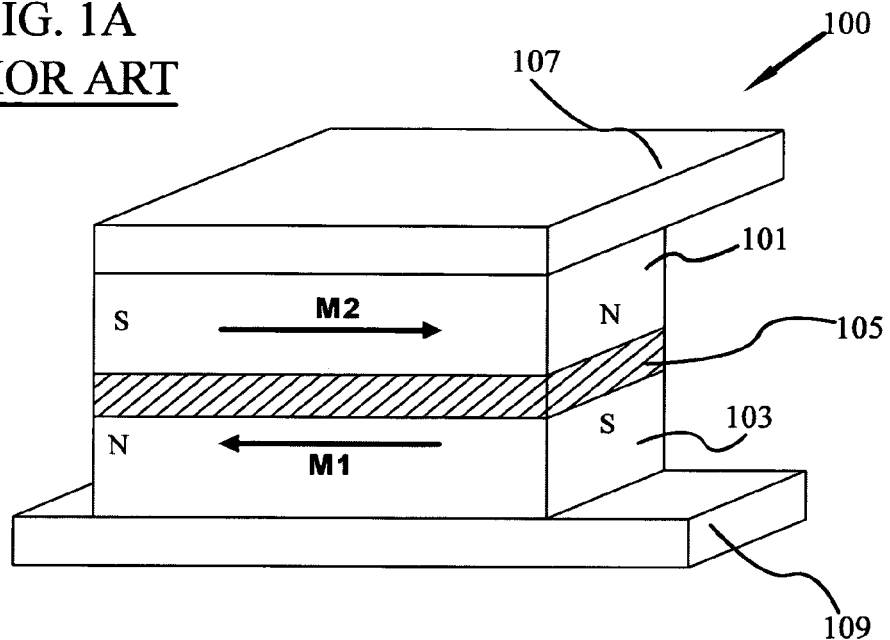
FIGS. 1A–1B provide perspective views of a prior art magnetic memory cell.
Figure 1B:
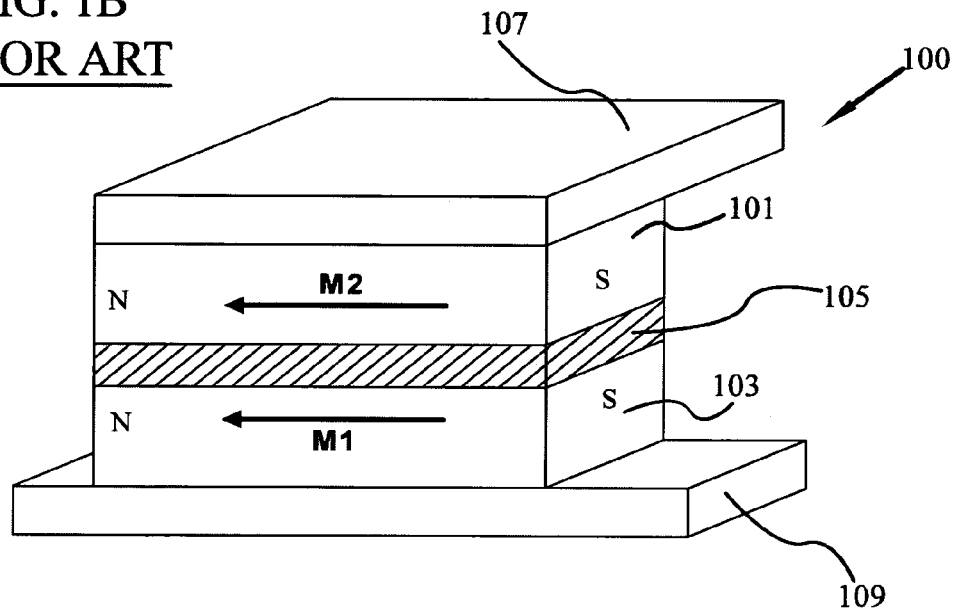
Figure 2:
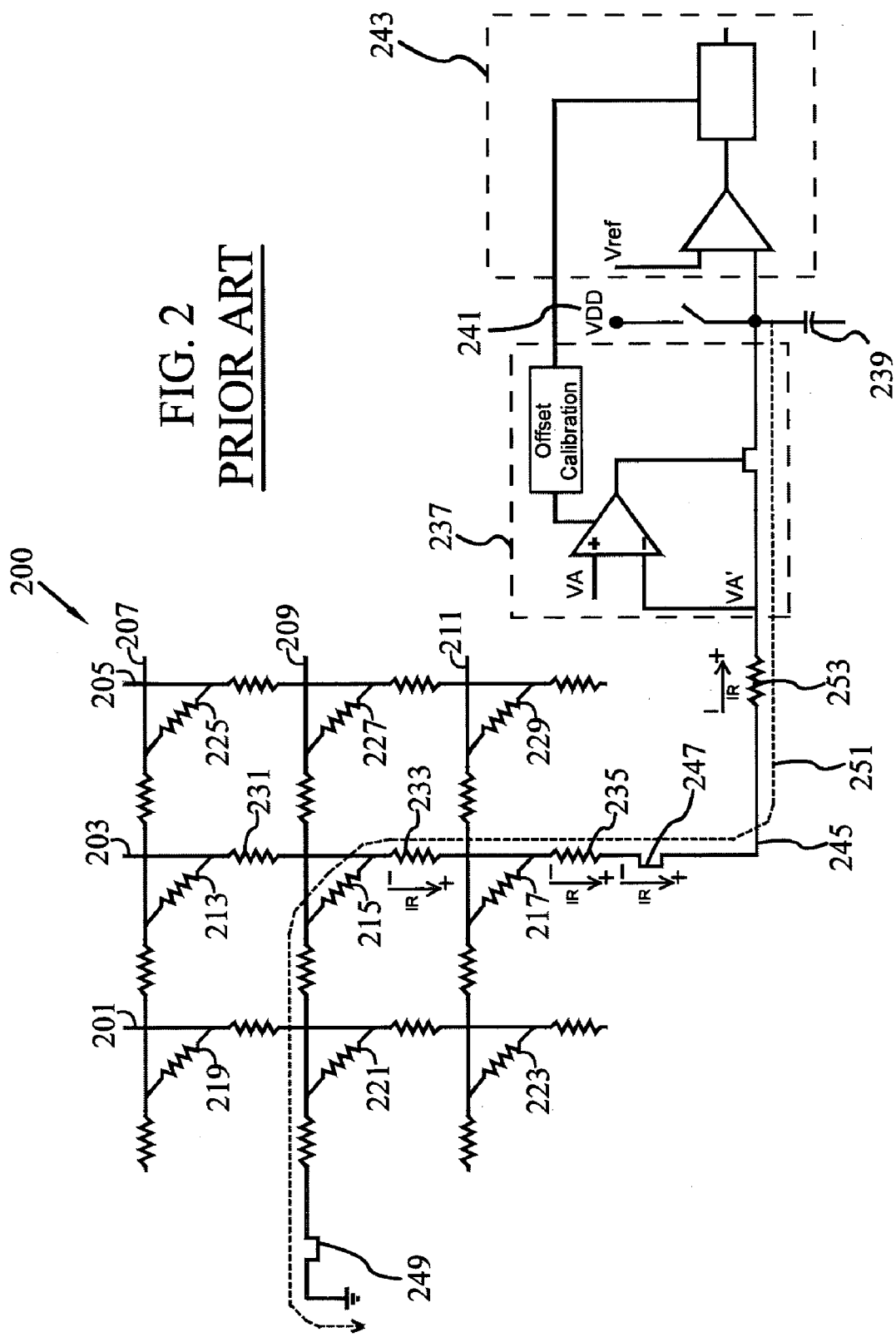
FIG. 2 is an illustration of the prior art sensing of a cross-point array of cells as shown in FIGS. 1A–1B.
Figure 3:
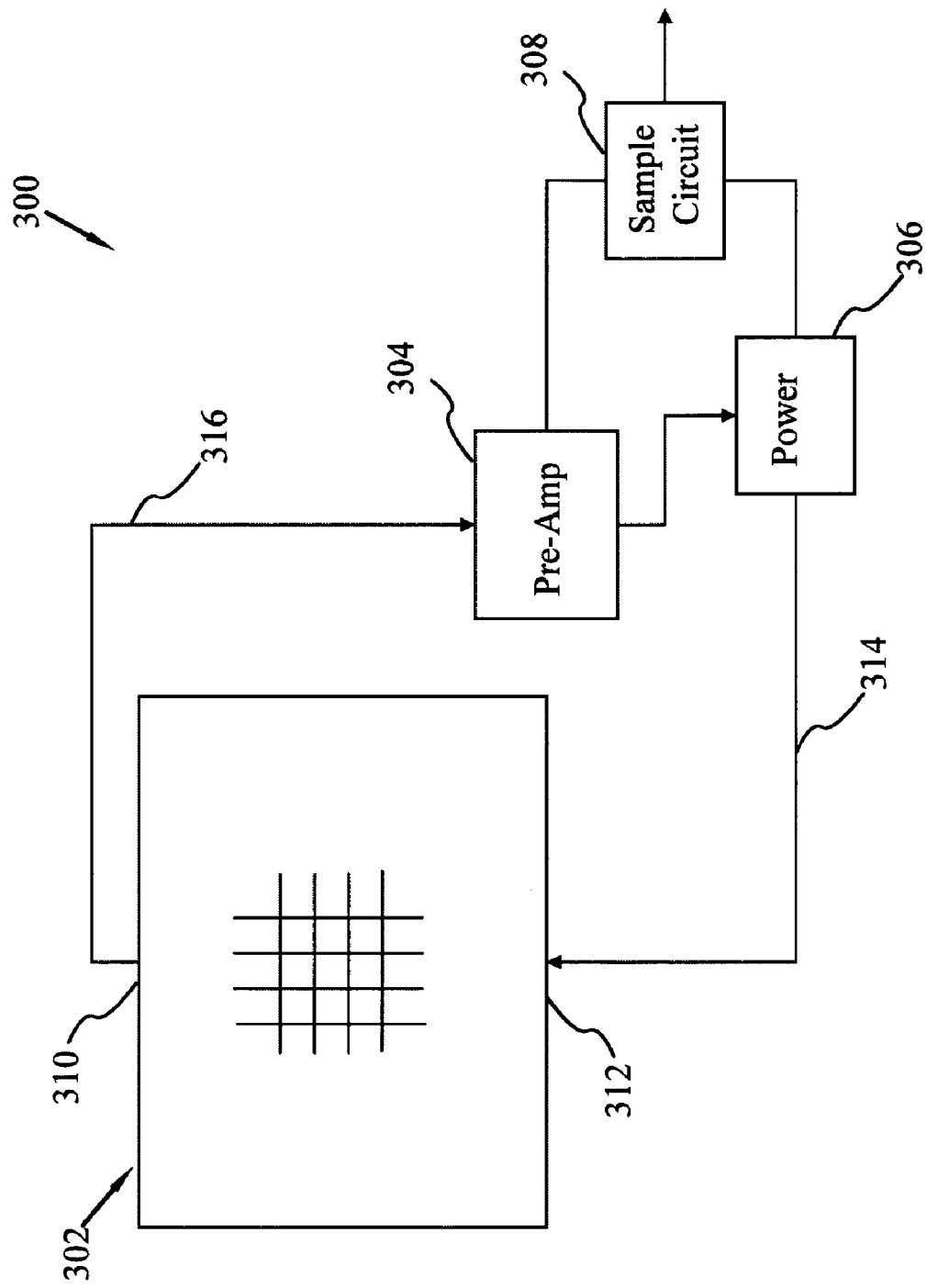
FIG. 3 is a block diagram of the remote sensing pre-amplifier for a cross-point array according to the present invention.

Referring now to the drawings, and more particularly to FIG. 3, there is shown a portion of a data storage device 300, including a cross-point array 302 of resistive devices and a feedback controlled sense pre-amplifier 304. The data storage device 300, may further include a power source 306 and sampling circuit 308, such as a self-reference triple sample sense circuit providing a digital output representing the state of a selected resistive device within the cross-point array 302.

The feedback controlled sense pre-amplifier 304, is a remote sensed pre-amplifier. Feedback is obtained from the remote side 310 of the cross-point array 302, rather than the local side 312 (proximate to the voltage supply) to which the input voltage potential is applied by power path 314.

More specifically, as shown, the sense path 316 is providing the feedback from the cross-point array 302 to the feedback controlled sense pre-amplifier 304, and is separated from the power supply path 314 providing voltage to the selected resistive device in the cross-point array 302. Based upon the remote sensed feedback, the pre-amplifier 304 directs adjustment of the voltage being supplied.

Figure 4:
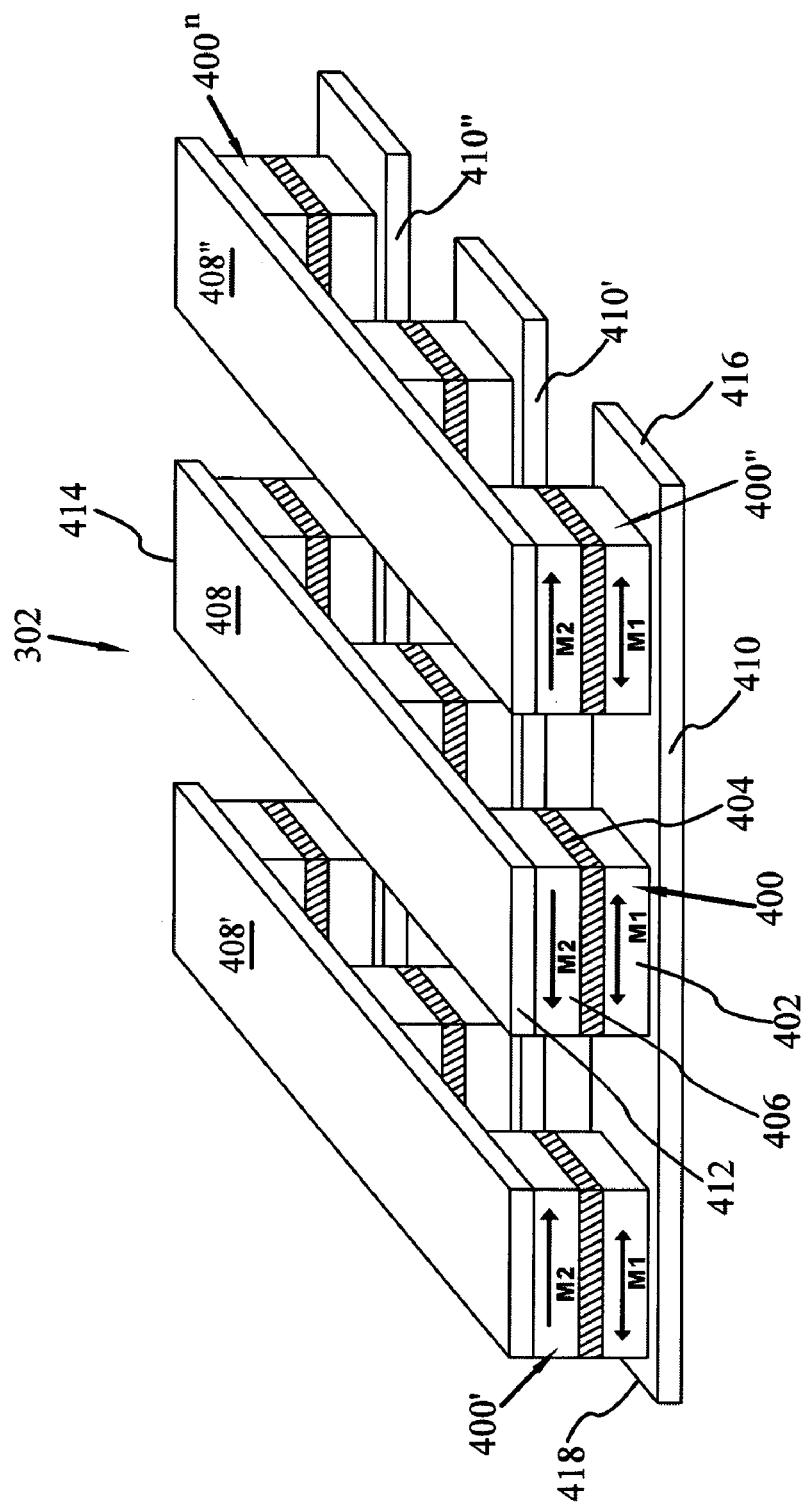
FIG. 4 is a partial perspective view of the cross-point array shown in FIG. 3.

As shown in FIG. 4, in at least one embodiment, the resistive cross-point array 302 is comprised of spin valve memory (SVM) cells 400, 400', 400'', 400'''. Each SVM cell 400 includes at least one ferromagnetic data layer 402, an intermediate layer 404, and a ferromagnetic reference layer 406. The ferromagnetic data layer 402 permits the storing of a bit of data as an alterable orientation of magnetization M2. The intermediate layer 404 has opposing sides such that the data layer 402 in contact with one side is substantially in direct alignment with, and substantially uniformly spaced from, the reference layer 406.

In at least one embodiment, the reference layer 406 is a pinned reference layer, characterized by a pinned orientation of magnetization M1. In at least one alternative embodiment, the reference layer is a soft-reference layer, characterized by a non-pinned orientation of magnetization M1 and a lower coercivity than the data layer 402.

The ferromagnetic data layer 402 and the reference layer 406 may be made from a material that includes, but it not limited to: Nickel Iron (NiFe), Nickel Iron Cobalt (NiFeCo), Cobalt Iron (CoFe), and alloys of such metals. In at least one embodiment the data layer 402 and reference layer 406 are made from NiFe. In addition, both the reference layer 406 and the data layer 402 may be formed from multiple layers of materials. However, for conceptual simplicity and ease of discussion, each layer component is herein discussed as a single layer.

As shown, a plurality of electrically conductive columns 408, 408' and 408'' cross a plurality of electrically conductive rows 410, 410' and 410'', thereby forming a plurality of intersections. Each electrically conductive column 408~408'' has a first end 412 and a second end 414. Likewise, each electrically conductive row 410~410'' has a first end 416 and a second end 418. Each SVM cell (400, 400', 400'', 400''') is in electrical contact with, and located at an intersection between, a row and a column. As such, electrical current and magnetic fields may be provided to the SVM cell 400 within the cross-point array 302 by electrically conductive column 408 and electrically conductive row 410

Figure 5:
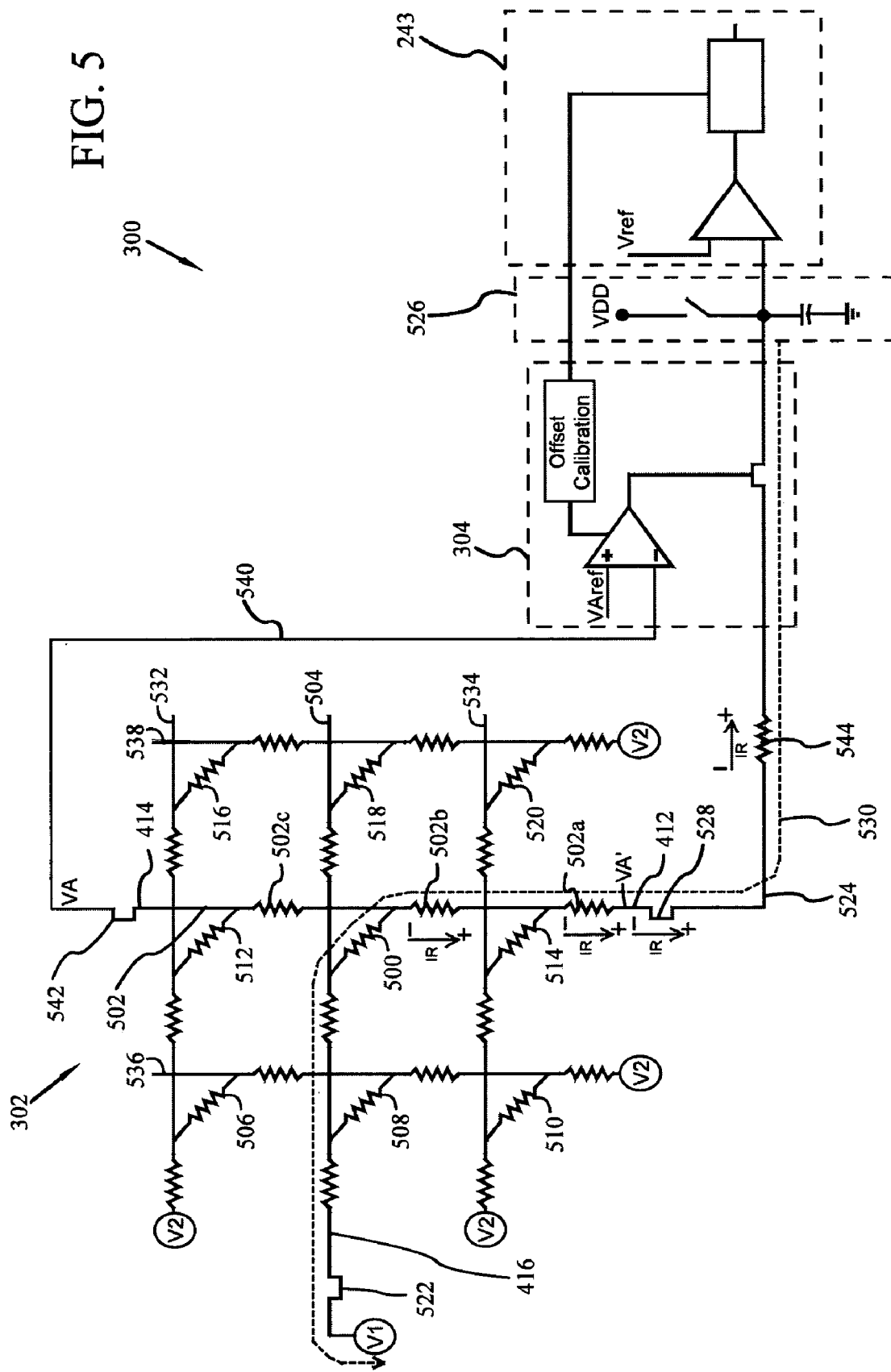
FIG. 5 is a refined illustration of the remote sensing pre-amplifier for a cross point array as shown in FIG. 3.

FIG. 5 provides a conceptual electrical schematic of data storage device 300 and cross-point array 302. A selected SVM cell is represented by resistor 500, along selected column 502 and selected row 504. Unselected SVM cells are represented by resistors 506, 508, 510, 512, 514, 516, 518 and 520.

SVM cell 500 is selected by applying a first voltage potential V1 to the first end 416 of conductive row 504. This connection is facilitated by switching element 522. An operating potential is applied to SVM cell 500 by power conductor 524 running from power source 526 to switching element 528, selecting the first end 412 of column 502. The power path through the selected SVM cell 500 is represented by dotted line 530. The sample circuit 308 shown in FIG. 3 is represented in FIG. 5 by a digital to analog converter 243.

To provide the equi-potential setting substantially reducing and or eliminating the sneak path currents that may occur through the remaining unselected SVM cells of cross-point array 302, a second voltage V2 is applied to at least a subset of the unselected rows 532 and 534, and unselected columns 536 and 538. This second voltage V2 is substantially equal to VA.

In an equi-potential setting, the most variable voltage in the cross-point array 302 is VA, the voltage actually presented to the selected SVM cell 500. At least two factors are involved in this. First, in determining the state of SVM cell 500 the initial measured resistance of SVM cell 500 is compared with the measured resistance of SVM cell 500 when oriented to either or both a known parallel and/or anti-parallel state. Second, conductive column 502, power conductor 524 and switching element 528 tend to contribute at least some resistance. The resistive property of the power conductor 524 is illustrated as resistor 544.

The resistance of column 502 is illustrated as resistors 502a, 502b and 502c. As selected SVM cell 500 lies in the middle of cross-point array 302, resistors 502a and 502b are at play in VA. Selecting SVM cell 512 adds resistor 502c, while selecting SVM 514 removes resistor 502b.

The function of the feedback sensing pre-amplifier 304 is to reduce the difference between two input voltages. A reference voltage, VAref, is applied to the "+" terminal and the feedback voltage VA is applied to the "−" terminal. In at least one embodiment, VAref is substantially equal to V2.

As is clearly shown in FIG. 5, the feedback of VA is provided by independent sense path 540, connecting to column switching element 542, selecting the second end 414 of selected column 502. As such, the feedback sense path 540 is substantially separated from power path 530. The point from which the feedback of VA is determined is described as remote because it is opposite from the local point at which the voltage is supplied to the cross-point array 302.

It is to be understood and appreciated that cross-point array 302 of MRAM cells will provide switching elements at both ends of either the column conductor (as shown) or row conductor, or both. Two switching elements are provided because of the necessity to reverse the flow of current to provide magnetic switching fields in at least two known directions. Where a resistive cross-point array device is employed without a second switching device at the second end of the row or column, adding the additional second switching device permits the advantages described herein.

As the feedback sense path is remote in its connection to the second end 414 of the selected column 502, the precise location of selected SVM cell 500 along the selected column 502 is, advantageously, substantially irrelevant. More specifically, the resistive properties of column 502, represented as resistors 502a~502c, will remain unchanged by the location of selected SVM cell 500, as will the resistive properties of switching element 528 and power conductor 524. As such, a substantially accurage value of VA may be determined by the feedback voltage permitting the feedback sensing pre-amplifier 304 to precisely measure and adjust VA as it is supplied by the power path to cross-point array 302.

The remote sensing pre-amplifier 304 has additional advantages as well. For example, as the controlling feedback is derived from the cross-point array 302 itself, the remote sensing pre-amplifier 304 advantageously accommodates other factors such as, for example, temperature or magnetic fields that may affect the resistive properties of the cross-point array 302 and or the specific selected resistive device, i.e., the SVM cell 500.

By maintaining a substantially equi-potential set of voltages, when the resistance of the circuit through the selected SVM cell 500 changes, there will be a measured change in current corresponding to the change in resistance. By applying a constant voltage to the SVM cell 500 and measuring the changes in current, the change in resistance may be inferred. In at least one embodiment, the feedback sensing pre-amplifier 304 is understood and appreciated to be an equi-potential sense pre-amplifier.

Having described the above physical embodiment of the data device 300 with remote sensing pre-amplifier 304, another embodiment relating to the method of use for the remote feedback sensing pre-amplifier 304 will now be described with reference to the Flowchart of FIGS. 6A and 6B. It will be appreciated that the described method need not be performed in the order in which it is herein described, but that this description is merely exemplary of at least one method of using the remote feedback sensing pre-amplifier 304, in accordance with the present invention.

Figure 6A:
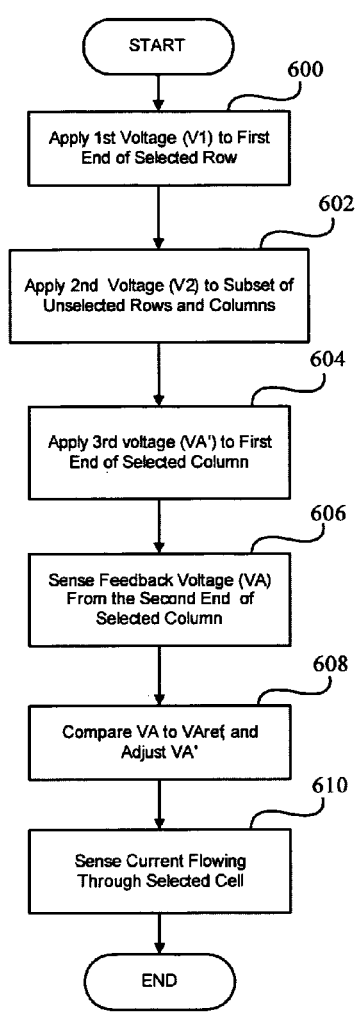
FIGS. 6A–6B is a flowchart depicting the steps of remote sensing the cross-point array as shown in FIG. 5 and FIG. 4.

Referring to the components illustrated in FIG. 5, and as indicated in the flowchart of FIG. 6A, the selection of a specific SVM cell may commence with the application of a first voltage (V1) to the first end 416 of a selected row 504, as shown in block 600. Selection of the first end 416 of a specific selected row 504 is accomplished with switching element 522. To establish the equi-potential characteristics of cross-point array 302, a second voltage (V2) is applied to at least a subset of the unselected rows and columns, as shown in block 602.

A third voltage (VA') is applied to the first end 412 of the selected column 502, as shown in block 604. Selection of the first end of a specifically selected column 502 is accomplished with switching element 528. The remote sense feedback path 540 is connected by switching element 542 to the second end 414 of selected column 502. The sense feedback path 540 supplies the feedback of VA to the remote sensing pre-amplifier 304, as shown in block 606.

To provide the proper adjustment to VA, an offset calibration is performed. More specifically VA is compared with a reference voltage VAref, such as VAref-VA', as shown in block 608. The pre-amplifier 304 then adjusts VA' as it is delivered by the power conductor 524 to the first end 412 of the selected column 502. In at least one embodiment, V2 is substantially equi-potential to the VA. In addition, the VAref is substantially equal to V2.

The VAref may be pre-determined, however under appropriate circumstances a calibration cycle may be performed during the read operation to adjust VAref-VA to substantially zero. Following the calibration operation, the read cycle continues as herein described. Having thus established an equi-potential setting within the cross-point array 302, the current flowing through the selected SVM cell 500 is then sensed and the data state inferred, as shown in block 610.

More specifically, as shown in FIG. 4, and as described above, the SVM cells permit the storing of a bit of data as an alterable orientation of magnetization, M1. When the orientation of the reference layer 406 is parallel to the orientation of the data layer 402 the resistance within the SVM cell will be high, data "0." When the orientation of the reference layer 406 is anti-parallel to the orientation of the data layer 402 the resistance within the SVM cell will be low, data "1."

Figure 6B:
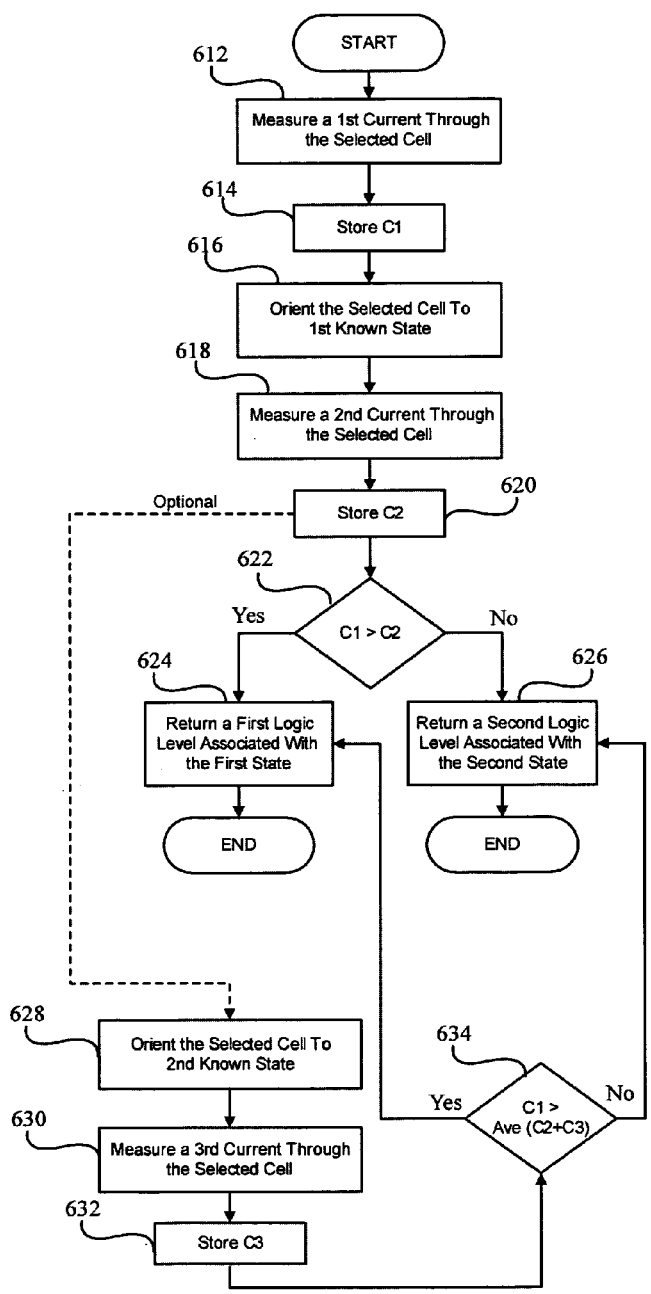

The flowchart of FIG. 6B illustrates at least one method of determining the data value within the selected cell. In at least one embodiment, with the cross-point array 302 in an equi-potential state, the sensing of the current through the selected SVM cell is accomplished in the following manner. A measurement of a first current (C1) flowing through the selected cell is made and recorded as shown in blocks 612 and 614. In at least one embodiment, this measurement of current flow is made according to an integration time.

The orientation of the selected SVM cell 500 is then set to a known orientation, as shown in block 616. This may be achieved by writing the data layer 402 to a known direction. In at least one alternative embodiment involving a soft-reference layer 406, the orientation of the soft-reference layer 406 may be aligned to a known direction. The alignment of the data layer 402, or soft-reference layer 406 is accomplished by applying a sufficient magnetic field to the SVM cell 500.

With the magnetic field of the SVM cell 500 oriented in a known direction, the measurement of a second current (C2) is made and recorded while VA is adjusted by the pre-amplifier 304, as shown in blocks 618 and 620. With the value of C2 now known, C1 and C2 may be compared, such as C1>C2 as shown in decision 622. As C2 is a known orientation, the state of the SVM cell 500 may be inferred by the result of the comparison. If the initial current is greater than the second current (C1>C2), a first logic level associated with the first state is returned, as shown in block 624. Where the initial current is not greater than the second current, a second logic level associated with the second state is returned, block 626.

In at lest one embodiment, a triple sample sense may be performed. For a triple sense the orientation of the cell is set first to a known orientation and a measurement of a first current (C1) is taken as indicated above. A measurement of the current C2 is taken and recorded, as shown in block 620. An optional oath is now taken illustrated as a dotted line. The orientation of the cell is then set to a second known orientation, opposite to the first, as shown in block 628. A measurement of a third current C3 is then taken and recorded, as shown in blocks 630 and 632. C2 and C3 may then be taken and averaged for comparison with C1—the initial value sensed in an unknown state, as shown in decision 634. Where the data layer 402 is re-oriented, it is understood and appreciated that, if necessary, a write-back will be performed to restore the initial orientation of M2.

It is understood and appreciated that a convention will be adopted such as, for example, a logic state of "1" exists where M1 and M2 are anti-parallel (high resistance) in a first state, and a logic state of "0" exists where M1 and M2 are parallel (low resistance) in a second state. It is important to note that the sensing of the initial resistance (the first resistance) may be performed repeatedly, and averaged. So too may the sensing of the second resistance be performed repeatedly, as it is well known and appreciated that with greater sampling there is a reduction in arbitrary error.

Another embodiment may be appreciated to be a computer system incorporating the memory device with remote feedback sensing pre-amplifier 304. A computer with a main board, CPU and at least one memory store comprised of an embodiment of the memory device 300 with remote feedback sensing pre-amplifier 304, described above, raises the advantages of the improved memory device 300 to a system level.

Figure 7:
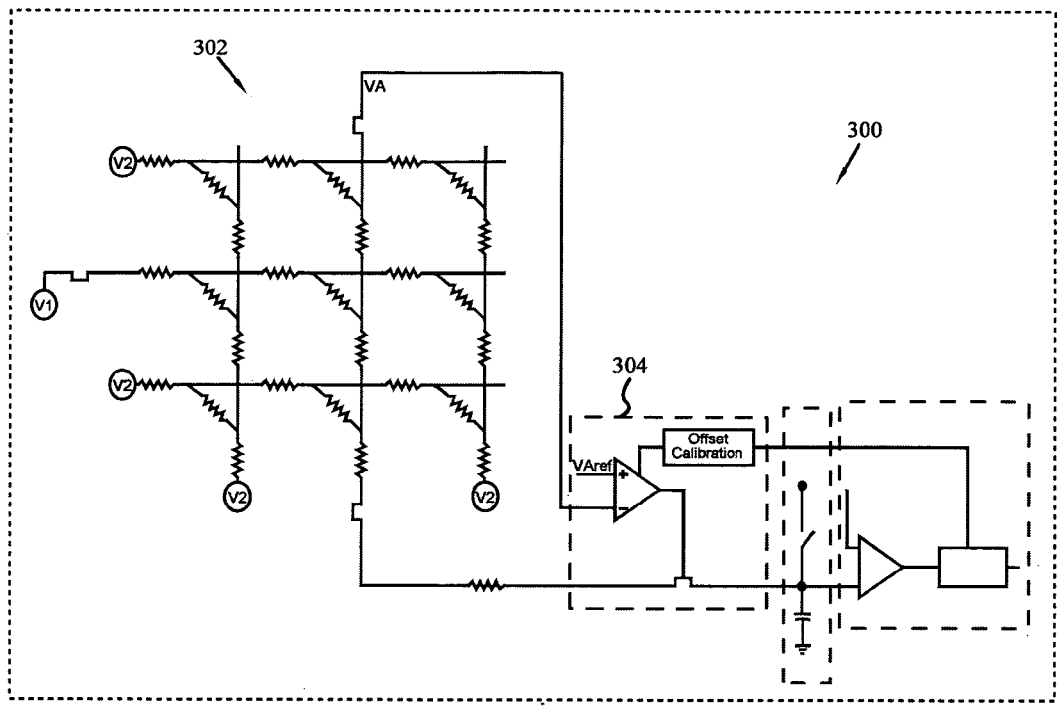
FIG. 7 is a schematic block diagram of a computer incorporating the remote sensing pre-amplifier for a cross point array as shown in FIG. 5.
Figure 7:
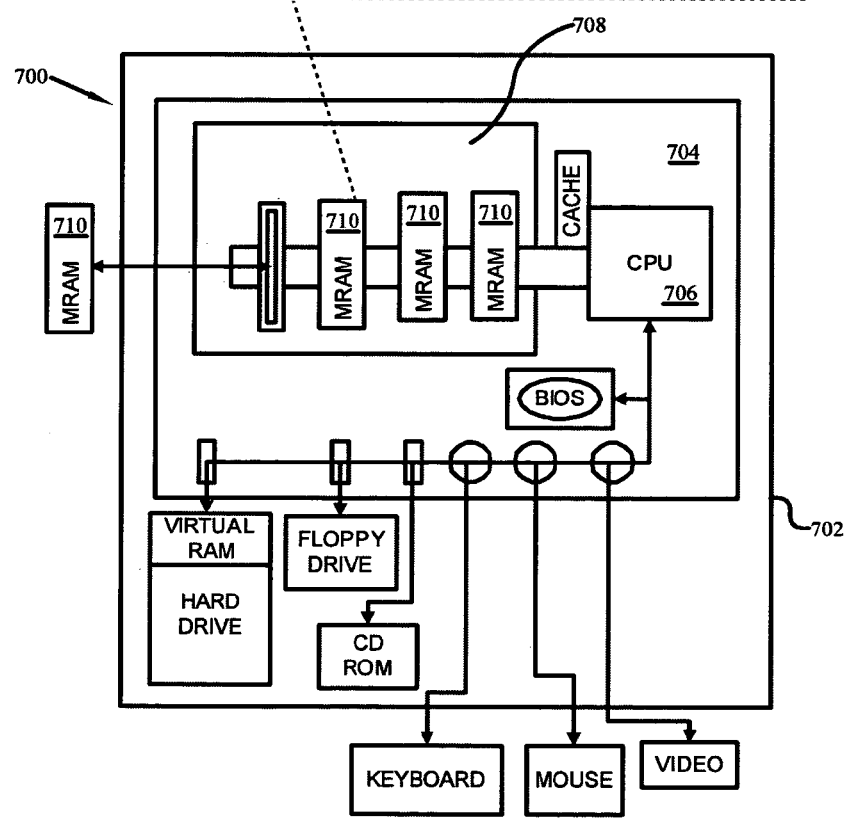

Such a computer system is conceptually illustrated in FIG. 7. Computer 700 has a case 7C2 enclosing a main board 704, also commonly known as a motherboard. As is understood and appreciated by those in the art, the main board 704 is the central circuit board of the computer 700 coupling a CPU 706 to main memory, such as memory store 708, and other computer components and peripheral devices such as, for example, video display, speaker, keyboard, mouse and/or other devices. As stated above, MRAM is a magnetic form of RAM and as such it may be structure and arranged to function in place of traditional RAM as memory store 708. In at least one embodiment, the memory store 708 composed of MRAM 710, is a data storage device 300, including a cross-point array 302 of resistive devices and a feedback controlled sense pre-amplifier 304 as described above. The structure and arrangement of MRAM 710 as single in-line memory modules (SIMM), dual in-line memory module (DIMM), dual in-line memory module (SQDIMM), or other memory module plugged into, or soldered directly onto, the main board 702 as memory store 706 is a matter of application preference to be determined by those skilled in the art.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

I claim:

1. A data storage device comprising:
   a cross-point array of resistive devices; and
   a feedback controlled sense pre-amplifier receiving a reference voltage and feedback from the cross-point array when a potential is applied to a selected resistive device within the array, the sense pre-amplifier adjusting the applied potential to minimize the difference between the feedback and reference voltage;
   wherein the feedback is received from an independent sense path.

2. The data storage device of claim 1, wherein the feedback controlled sense pre-amplifier is an equi-potential sense pre-amplifier.

3. The data storage device of claim 1, wherein the cross-point array includes:
   a plurality of parallel electrically conductive rows; and
   a plurality of parallel electrically conductive columns crossing the rows, each thereby forming a cross point array with a plurality of intersections;
   wherein each resistive device is in electrical contact with and located at an intersection between a row and column.

4. The data storage device of claim 3, wherein each column has a first end and a second end, and a select element coupled to each end.

5. The data storage device of claim 4, wherein the feedback is obtained from the select element at the second end of a selected column, and the potential is applied to the select element at the first end of the selected column.

6. The data storage device of claim 3, wherein the resistive devices are magnetic memory cells, each memory cell including:
   at least one ferromagnetic data layer characterized by an alterable orientation of magnetization;
   an intermediate layer in contact with the data layer; and
   at least one ferromagnetic reference layer in contact with the intermediate layer, opposite from the data layer.

7. The data storage device of claim 6, wherein the reference layer is a soft-reference layer.

8. A resistive cross-point array comprising:
   a plurality of parallel electrically conductive rows, each having a first and second end;
   a plurality of parallel electrically conductive columns crossing the rows, each having a first and second end, thereby forming a cross point array with a plurality of intersections;
   a plurality of resistive devices, each device in electrical contact with and located at an intersection between a row and column;
   a feedback controlled sense pre-amplifier receiving a reference voltage and a feedback voltage from the second end of a selected column when a potential is applied to a selected resistive device connected to the first end of the selected column, the sense pre-amplifier adjusting the applied potential to minimize the difference between the feedback and reference voltage.

9. The resistive cross-point array of claim 8, wherein the potential is applied to the first end of the selected column.

10. The resistive cross-point array of claim 8, wherein the feedback controlled sense pre-amplifier is an equi-potential sense pre-amplifier.

11. The resistive cross-point array of claim 8, wherein the feedback is received from an independent sense path.

12. The resistive cross-point array of claim 8, wherein the resistive devices are magnetic memory cells, each memory cell including:
    at least one ferromagnetic data layer characterized by an alterable orientation of magnetization;
    an intermediate layer in contact with the data layer; and
    at least one ferromagnetic reference layer in contact with the intermediate layer, opposite from the data layer.

13. The resistive cross-point array of claim 12, wherein the reference layer is a soft-reference layer.

14. The resistive cross-point array of claim 8, further including a circuit for sensing resistance states of a selected resistive device during read operations on the selected resistive device, the circuit;
    applying a first voltage to the first end of a selected row conductor;
    applying a second voltage to at least a subset of unselected row and unselected column conductors;
    applying a third voltage to the first end of a selected column conductor, the third voltage being substantially equi-potential to the second voltage;
    sensing a feedback voltage from the second end of the selected column conductor; and
    adjusting the third voltage by the feedback controlled sense pre-amplifier to minimize the difference between the feedback and reference voltage.

15. The resistive cross-point array of claim 14, wherein the third voltage is adjusted as the resistance state of the resistive device is changed.

16. The resistive cross-point array of claim 14, wherein the reference voltage applied to the feedback controlled sense pre-amplifier is substantially equal to the second voltage.

17. A magnetic memory device with remote sensed pre-amplifier comprising:
- a plurality of parallel electrically conductive rows, each having a first and second end;
- a plurality of parallel electrically conductive columns crossing the rows, each having a first and second end, thereby forming a cross point array with a plurality of intersections;
- a plurality of magnetic memory cells, each cell in electrical contact with and located at an intersection between a row and column;
- a feedback controlled sense pre-amplifier receiving a reference voltage and feedback from the second end of a selected column when a potential is applied to a selected memory cell connected to the first end of the selected column, the sense pre-amplifier adjusting the applied potential to minimize the difference between the feedback and reference voltage.

18. The magnetic memory device of claim 17, wherein the each memory cells includes:
- at least one ferromagnetic data layer characterized by an alterable orientation of magnetization;
- an intermediate layer in contact with the data layer; and
- at least one ferromagnetic reference layer in contact with the intermediate layer, opposite from the data layer.

19. The magnetic memory device of claim 18, wherein the reference layer is a soft-reference layer.

20. The magnetic memory device of claim 17, wherein the feedback is received from an independent sense path.

21. The magnetic memory device of claim 17, wherein including a circuit for sensing resistance states of a selected memory cell during read operations on the selected memory cell, the circuit;
- applying a first voltage to the first end of a selected row conductor;
- applying a second voltage to at least a subset of unselected row and unselected column conductors;
- applying a third voltage to the first end of a selected column conductor, the third voltage being substantially equi-potential to the second voltage;
- sensing a feedback voltage from the second end of the selected column conductor; and
- adjusting the third voltage by the feedback controlled sense pre-amplifier to minimize the difference between the feedback and reference voltage.

22. The magnetic memory device of claim 21, wherein the third voltage is adjusted as the resistance state of the selected memory cell is changed.

23. The magnetic memory device of claim 21, wherein the reference voltage applied to the feedback controlled sense pre-amplifier is substantially equal to the second voltage.

24. A computer system comprising:
- a main board;
- at least one central processing unit (CPU) coupled to the main board; and
- at least one memory store joined to the CPU by the main board, the memory store including;
  - a plurality of parallel electrically conductive rows, each having a first and second end;
  - a plurality of parallel electrically conductive columns crossing the rows, each having a first and second end, thereby forming a cross point array with a plurality of intersections;
  - a plurality of magnetic memory cells, each cell in electrical contact with and located at an intersection between a row and column;
  - a feedback controlled sense pre-amplifier receiving a reference voltage and feedback from the second end of a selected column when a potential is applied to a selected memory cell connected to the first end of the selected column, the sense pre-amplifier adjusting the applied potential to minimize the difference between the feedback and reference voltage.

25. The computer system of claim 24, wherein the feedback is received from an independent sense path.

26. The computer system of claim 24, wherein the memory store further includes a circuit for sensing resistance states of a selected memory cell during read operations on the memory cell, the circuit;
- applying a first voltage to the first end of a selected row conductor applying a second voltage to at least a subset of unselected row and unselected column conductors;
- applying a third voltage to the first end of a selected column conductor, the third voltage being substantially equi-potential to the second voltage;
- sensing a feedback voltage from the second end of the selected column conductor; and
- adjusting the third voltage by the feedback controlled sense pre-amplifier to minimize the difference between the feedback and reference voltage.

* * * * *